(12) United States Patent
Usuda

(10) Patent No.: US 10,432,177 B2
(45) Date of Patent: Oct. 1, 2019

(54) CIRCUIT DEVICE, REAL-TIME CLOCKING DEVICE, ELECTRONIC APPARATUS, VEHICLE, AND VERIFICATION METHOD

(71) Applicant: Seiko Epson Corporation, Tokyo (JP)

(72) Inventor: Toshiya Usuda, Ina (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/872,200

(22) Filed: Jan. 16, 2018

(65) Prior Publication Data

US 2018/0212593 A1    Jul. 26, 2018

(30) Foreign Application Priority Data

Jan. 20, 2017   (JP) ................... 2017-008029

(51) Int. Cl.
| | |
|---|---|
| *H03K 3/02* | (2006.01) |
| *H03K 3/0231* | (2006.01) |
| *H03K 5/26* | (2006.01) |
| *H03B 5/36* | (2006.01) |
| *G06F 1/14* | (2006.01) |
| *H03B 5/04* | (2006.01) |

(52) U.S. Cl.
CPC ............. *H03K 3/0231* (2013.01); *G06F 1/14* (2013.01); *H03B 5/36* (2013.01); *H03K 5/26* (2013.01); *H03B 5/04* (2013.01); *H03B 2200/004* (2013.01); *H03B 2200/008* (2013.01); *H03B 2201/0208* (2013.01)

(58) Field of Classification Search
CPC .......... H03K 3/0231; H03K 5/26; H03B 5/36; H03B 5/04; H03B 2200/004; H03B 200/008; G06F 1/14
USPC ........................................................ 327/291
See application file for complete search history.

(56) References Cited

U.S. PATENT DOCUMENTS

| | | | | |
|---|---|---|---|---|
| 5,943,489 | A * | 8/1999 | Shiratori | G06F 17/5022 703/16 |
| 6,330,297 | B1 * | 12/2001 | Kano | G11C 29/12 324/527 |
| 7,242,611 | B2 * | 7/2007 | Fujisawa | G11C 11/5628 365/185.03 |
| 7,360,116 | B2 * | 4/2008 | Nakamura | G01R 31/31813 714/30 |
| 2014/0157432 | A1 * | 6/2014 | Honzumi | G06F 21/60 726/27 |

FOREIGN PATENT DOCUMENTS

| | | |
|---|---|---|
| JP | 2002-022863 A | 1/2002 |
| JP | 2010-225009 A | 10/2010 |

\* cited by examiner

*Primary Examiner* — Dinh T Le
(74) *Attorney, Agent, or Firm* — Harness, Dickey & Pierce, P.L.C.

(57) ABSTRACT

A circuit device includes an oscillation circuit that generates an oscillation signal by using an resonator, a clocking circuit that generates clocking data which is real-time clock information based on the oscillation signal, a verification data generation circuit that generates verification data for verifying the clocking data based on the oscillation signal, and an interface circuit that outputs the clocking data and the verification data.

15 Claims, 12 Drawing Sheets

|  | DATA | UNIX TIME |
|---|---|---|
| CLOCKING DATA | 2016/12/1 10:20:30 | 1480555230 |
| SECOND CLOCKING DATA | 2000/1/1 0:00:00 | 946652400 |
| DIFFERENCE (=XA) |  | 533902830 |

FIG. 5

|  | DATA | UNIX TIME |
|---|---|---|
| CLOCKING DATA | 2017/1/1 10:20:30 | 1483233630 |
| SECOND CLOCKING DATA | 2000/2/1 0:00:00 | 949330800 |
| DIFFERENCE (=XB) |  | 533902830 |

FIG. 6

|  | DATA | UNIX TIME |
|---|---|---|
| CLOCKING DATA | 2016/12/1 10:20:30 | 1480555230 |
| COUNTED VALUE | 0 | 0 |
| DIFFERENCE (=XA) |  | 1480555230 |

FIG. 8

|  | DATA | UNIX TIME |
|---|---|---|
| CLOCKING DATA | 2017/1/1 10:20:30 | 1483233630 |
| COUNTED VALUE | 2000/2/1 0:00:00 | 949330800 |
| DIFFERENCE (=XB) |  | 533902830 |

FIG. 9

|  | DATA | UNIX TIME | UNIX TIME/60 |
|---|---|---|---|
| CLOCKING DATA | 2016/12/1 10:20:30 | 1480555230 | 24675921 |
| COUNTED VALUE | 0 | | 0 |
| DIFFERENCE (=XA) | | | 24675921 |

FIG. 11

|  | DATA | UNIX TIME | UNIX TIME/60 |
|---|---|---|---|
| CLOCKING DATA | 2017/1/1 10:20:30 | 1483233630 | 24720561 |
| COUNTED VALUE | 44640 | | 44640 |
| DIFFERENCE (=XB) | | | 24675921 |

FIG. 12

CIRCUIT DEVICE, REAL-TIME CLOCKING DEVICE, ELECTRONIC APPARATUS, VEHICLE, AND VERIFICATION METHOD

BACKGROUND

1. Technical Field

The present invention relates to a circuit device, a real-time clocking device, an electronic apparatus, a vehicle, a verification method, and the like.

2. Related Art

There has been known a real-time clocking device which is operated by a backup power supply, such as a battery, and continuously performs clocking (measuring of a real time) even when a main power supply of a system is turned off. Clocking data generated by the real-time clocking device is used as the present time of the system, and measures against fraudulent rewriting of the clocking data of the real-time clocking device may be required so that the present time of the system does not become a fraudulent time.

For example, JP-A-2010-225009 discloses a method in which an external device transmits an access code to a real-time clocking device when the external device has access to the real-time clocking device, the real-time clocking device compares the access code with an expected value, the real-time clocking device allows the access in a case where the access code is consistent with the expected value, and prohibits the access in a case where the access code is not consistent with the expected value.

Alternatively, JP-A-2002-022863 discloses a method in which when an electronic apparatus receives a standard radio wave to perform time correction, the electronic apparatus compares time information which is output by a reception unit with the present time of a clocking circuit, and stops performing the time correction to prevent fraudulent time rewriting when the time information and the present time exceed a predetermined time difference.

The system including the real-time clocking device has a problem in that there is a desire to confirm whether or not the clocking data read out from the real-time clocking device is fraudulent clocking data.

For example, in JP-A-2010-225009, authentication is performed during communication based on the comparison of the access code. In addition, in JP-A-2002-022863, it is determined whether or not time correction is performed based on comparison between the received time information and the present time at the time of the time correction. In these methods, it is not possible to determine whether or not the clocking data is fraudulent data when the clocking data is read out from the real-time clocking device.

SUMMARY

According to some aspects of the invention, it is possible to provide a circuit device capable of confirming whether or not clocking data read out from a real-time clocking device is fraudulent clocking data, a real-time clocking device, an electronic apparatus, a vehicle, a verification method, and the like.

The invention can be implemented in the following exemplary configurations.

An aspect of the invention relates to a circuit device including an oscillation circuit that generates an oscillation signal by using an resonator, a clocking circuit that generates clocking data which is real-time clock information based on the oscillation signal, a verification data generation circuit that generates verification data for verifying the clocking data based on the oscillation signal, and an interface circuit that outputs the clocking data and the verification data.

According to the aspect of the invention, the clocking data and the verification data are generated based on the oscillation signal from the oscillation circuit. That is, the verification data is generated based on the same oscillation signal as the clocking data. Thereby, for example, it is possible to generate a difference between time-dependent data and data in which a difference from the clocking data does not change over time or data which changes over time in the same manner as the clocking data, and the like can be generated as the verification data. It is possible to confirm whether or not the clocking data read out from the real-time clocking device is fraudulent clocking data by using the verification data.

In the aspect of the invention, write access through the interface circuit may be restricted or prohibited for the verification data generation circuit.

In this manner, the write access to the verification data generation circuit through the interface circuit is restricted or prohibited, and thus it is possible to reduce a concern that the verification data is rewritten. Thereby, the reliability of the verification data readout by an external device is improved, and thus it is possible to verify the clocking data with high reliability by using the verification data.

In the aspect of the invention, the verification data generation circuit may include a counter that counts clock signals based on the oscillation signal, and the verification data may be based on a counted value of the counter.

In this manner, the verification data based on the counted value of the counter is output, and thus the external device can verify the clocking data. That is, the clocking data can be converted into a time (for example, the number of elapsed seconds, or the like) which is elapsed from a reference time. Since the elapsed time and the counted value of the counter are counted based on the same oscillation signal, it is expected that a difference between a value obtained by converting the clocking data into the elapsed time and the counted value does not change over time. On the other hand, in a case where the clocking data is fraudulently rewritten, a difference between the elapsed time and the counted value of the counter changes. The external device detects the change in the difference, and thus it is possible to determine that there is a possibility of fraudulent rewriting being performed.

In the aspect of the invention, the verification data generation circuit may output the counted value as the verification data.

In this manner, the external device compares a difference calculated from the clocking data and the verification data which are read out during the initialization of the circuit device, or the like with a difference calculated from the clocking data and the verification data which are read out during the setting of a time (restart-up) of the system, and thus it is possible to determine that there is a possibility of fraudulent rewriting being performed in a case where the differences are not consistent with each other.

In the aspect of the invention, the verification data generation circuit may output a difference between a value obtained by converting the clocking data into a time elapsed from a reference time and the counted value of the counter as the verification data.

In this manner, the external device compares the verification data which is read out during the initialization of the circuit device, or the like with the verification data which is read out during the setting of a time (restart-up) of the system, and thus it is possible to determine that there is a possibility of fraudulent rewriting being performed in a case where the pieces of verification data are not consistent with each other.

In the aspect of the invention, the verification data generation circuit may include a second clocking circuit that generates second clocking data based on the oscillation signal, and the verification data may be based on the second clocking data.

In this manner, the verification data based on the second clocking data is output, and thus the external device can verify the clocking data. That is, the clocking data and the second clocking data are counted based on the same oscillation signal, and thus it is expected that a difference between the clocking data and the second clocking data does not change over time. On the other hand, in a case where the clocking data is fraudulently rewritten, the difference between the clocking data and the second clocking data changes. The external device detects the change in the difference, and thus can determine that there is a possibility of fraudulent rewriting being performed.

In the aspect of the invention, the verification data generation circuit may output the second clocking data as the verification data.

In this manner, the external device compares a difference calculated from the clocking data and the verification data which are read out during the initialization of the circuit device, or the like with a difference calculated from the clocking data and the verification data which are read out during the setting of a time (restart-up) of the system, and thus it is possible to determine that there is a possibility of fraudulent rewriting being performed in a case where the differences are not consistent with each other.

In the aspect of the invention, the verification data generation circuit may output a difference between the clocking data and the second clocking data as the verification data.

In this manner, the external device compares the verification data which is read out during the initialization of the circuit device, or the like with the verification data which is read out during the setting of a time (restart-up) of the system, and thus it is possible to determine that there is a possibility of fraudulent rewriting being performed in a case where the pieces of verification data are not consistent with each other.

In the aspect of the invention, the clocking circuit may perform a counting operation based on a clock signal, which is obtained by performing frequency division of the oscillation signal, to generate the clocking data, and the verification data generation circuit may perform a counting operation based on a clock signal having the same frequency as the clock signal, which is obtained by performing frequency division of the oscillation signal, to generate the verification data.

In this manner, the clocking data and the verification data are generated based on clock signals which are generated from the same oscillation signal and have the same frequency. Thereby, the clocking data and the verification data have a value changing by one count for each clock of the clock signals, and a difference therebetween is maintained constant.

In the aspect of the invention, the clocking circuit may perform a counting operation based on a first clock signal, which is obtained by performing frequency division of the oscillation signal and has a first frequency, to generate the clocking data, and the verification data generation circuit may perform counting operation based on a second clock signal, which is obtained by performing frequency division of the oscillation signal and has a second frequency lower than the first frequency, to generate the verification data.

In this manner, the clocking data and the verification data are generated based on clock signals which are generated from the same oscillation signal and have different frequencies. In this case, a difference between data obtained by dividing the clocking data in a frequency ratio and the verification data is maintained constant.

Another aspect of the invention relates to a real-time clocking device including any one of the circuit devices described above and an resonator.

Still another aspect of the invention relates to an electronic apparatus including any one of the circuit devices described above and a device that receives the clocking data and the verification data.

In the still another aspect of the invention, the device may perform a process of verifying the clocking data based on the clocking data and the verification data.

Still another aspect of the invention relates to a vehicle including any one of the circuit devices described above.

Still another aspect of the invention relates to a method of verifying clocking data which is output by a real-time clocking device including a clocking circuit that generates clocking data based on an oscillation signal and a verification data generation circuit that generates verification data for verifying the clocking data based on the oscillation signal, the method including causing the clocking circuit to perform a process of setting a present time, reading out the clocking data and the verification data from the real-time clocking device, and performing a process of verifying the clocking data based on the read-out clocking data and the verification data.

BRIEF DESCRIPTION OF THE DRAWINGS

Embodiments of the invention will be described with reference to the accompanying drawings, wherein like numbers reference like elements.

FIG. 5 illustrates an example of a verification process in the first detailed configuration example.

FIG. 6 illustrates an example of a verification process in the first detailed configuration example.

FIG. 8 illustrates an example of a verification process in the second detailed configuration example.

FIG. 9 illustrates an example of a verification process in the second detailed configuration example.

FIG. 11 illustrates an example of a verification process in the third detailed configuration example.

FIG. 12 illustrates an example of a verification process in the third detailed configuration example.

DESCRIPTION OF EXEMPLARY EMBODIMENTS

Figure 1:
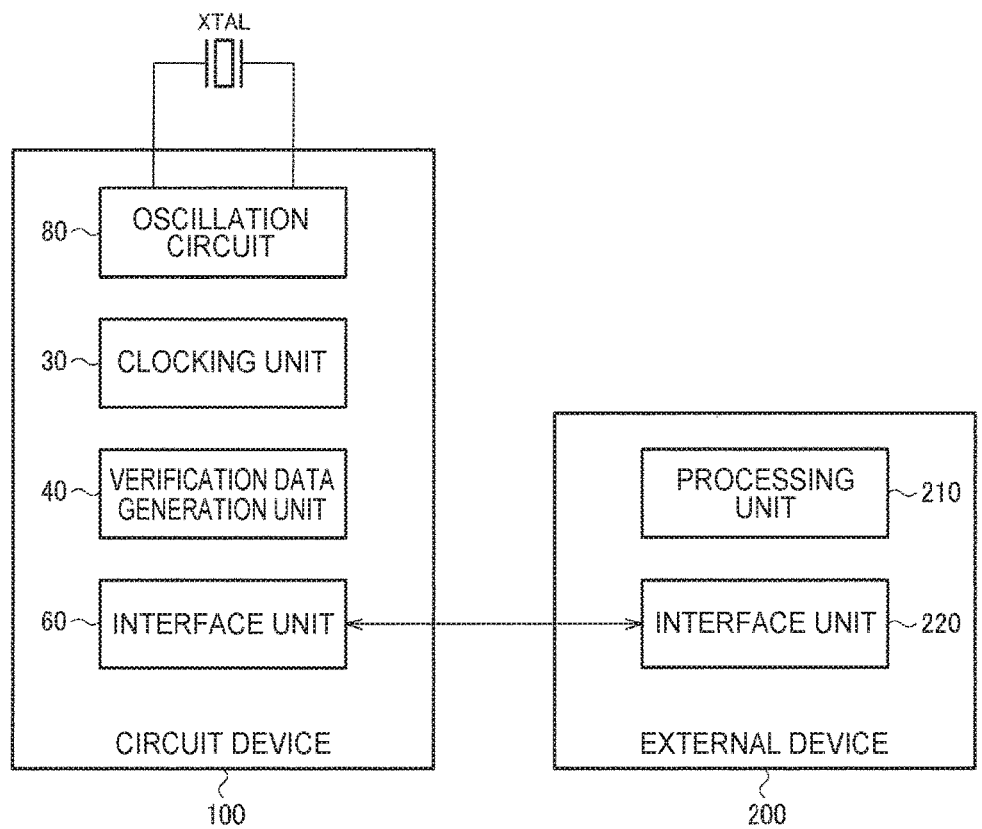
FIG. 1 illustrates a configuration example of a circuit device according to this exemplary embodiment and a system including the circuit device.

Hereinafter, a preferred exemplary embodiment of the invention will be described in detail. Meanwhile, this exemplary embodiment described below is not unduly limited to the contents of the invention described in the appended claims, and all configurations described in this exemplary embodiment is not necessarily essential as solving means of the invention.

1. CIRCUIT DEVICE AND SYSTEM

As described above, a real-time clocking device is a device that continuously performs clocking (measurement of a real time) by a backup power supply even when a main power supply of a system is turned off. In a case where the power supply of the system is first turned on or time correction of the real-time clocking device is performed, it is necessary to rewrite a time (clocking data) clocked by the real-time clocking device, and thus the clocking data of the real-time clocking device can be rewritten from an external device. For this reason, for example, there is a concern that the clocking data of the real-time clocking device is fraudulently rewritten due to fraudulent communication or the like.

For example, in a vehicle such as an automobile, an internal network and an external network (or an external device) of the vehicle communicate with each other through various communication such as mobile communication, Bluetooth (registered trademark) communication, or wired communication. There is a concern that fraudulent access to the real-time clocking device of the system connected to the internal network is made through such communication, and a time is rewritten.

As a security measure against such fraudulent time rewriting, authentication is performed during writing of clocking data in the related art such as JP-A-2010-225009 and JP-A-2002-022863 described above. However, in the related art, it is not possible to determine whether or not time data is normal (whether or not rewriting of fraudulent time data was performed in the past) during read-out.

In addition, as a method of determining whether or not time data is normal during read-out, a method of comparing time information (for example, time information acquired through a network) other than time information of the real-time clocking device and time data read out from the real-time clocking device is considered. However, in a case where the two compared times are clocked based on different source oscillation, a deviation in time occurs, and thus there is no means for determining which time is correct.

In addition, in a case of being considered as a security measure against fraudulent time rewriting regardless of whether or not being in the course of read-out, there is a problem in that complicated processing such as collation of an access code is necessary, for example, in the method disclosed in JP-A-2010-225009. In addition, in JP-A-2002-022863, whether to perform time correction depends on an actual difference time information received from the reception unit and a time of the clocking circuit, and thus there is also a concern that it is actually difficult to determine fraudulent time rewriting, for example, in a case where a difference in time is small.

FIG. 1 illustrates a configuration example of a circuit device according to this exemplary embodiment capable of solving the above-described problem and a system including the circuit device. The system illustrated in FIG. 1 includes a device (external device 200) and a circuit device 100. Meanwhile, the device is referred to as an external device in the sense that the device is provided outside the circuit device. The external device 200 includes a processing unit 210 and an interface unit 220 (interface circuit). The circuit device 100 includes an oscillation circuit 80, a clocking unit 30 (clocking circuit), a verification data generation unit 40 (verification data generation circuit), and an interface unit 60 (interface circuit). Meanwhile, the circuit device or the system are not limited to the configuration of FIG. 1, and various modifications such as the omission of a portion of the components and the addition of other components can be made thereto.

The external device 200 is, for example, a System On Chip (SOC). Alternatively, the external device may be a processing device such as a CPU or an MPU. The circuit device 100 can be realized by, for example, an integrated circuit device. For example, the circuit device 100 and an resonator XTAL of FIG. 1 are combined with each other to configure a real-time clocking device.

The oscillation circuit 80 generates an oscillation signal by using an resonator. The clocking unit 30 generates clocking data which is real-time clock information based on the oscillation signal. The verification data generation unit 40 generates verification data for verifying the clocking data based on the oscillation signal. The interface unit 60 outputs the clocking data and the verification data. Specifically, the interface unit 60 outputs the clocking data and the verification data to the external device 200.

The clocking data is data indicating a time as the real-time clock information. That is, the clocking data is data regarding a time clocked as the real-time clock information by the clocking unit 30. For example, the clocking data is data indicating a date and time, and may include calendar data and time data. For example, the calendar data is data such as year, month, week, and day, and the time data is data such as hour, minute, and second. For example, the clocking unit 30 performs frequency division of the oscillation signal to generate clock signals in cycles of one second, and measures a time by counting the clock signals.

The verification data is data for verifying whether or not the clocking data read out from the circuit device 100 is normal clocking data (that is, whether or not fraudulent time rewriting was performed in the past). That is, the verification data is data for verifying whether or not the clocking data is normal by the external device 200 performing a verification process using the verification data. Specifically, the verification data is data in which a difference between the clocking data and the verification data does not change over time. In this case, the external device 200 determines that the clocking data is not normal in a case where a difference between the clocking data and the verification data has changed. Alternatively, the verification data is data indicating a difference between time-dependent data and data changing over time in the same manner as the clocking data, and is a data that does not change over time. In this case, the external device 200 determines that the clocking data is not normal in a case where the verification data has changed. For example, the verification data can be generated by performing a counting operation (including, for example, a clocking operation, a simple counter operation, and the like) in accordance with the clock signal based on the oscillation signal.

In this exemplary embodiment, the clocking data and the verification data are generated based on the oscillation signal received from the oscillation circuit 80. That is, the verification data is generated based on the same source oscillation as clocking. Thereby, it is possible to generate a difference between the time-dependent data and the data in which a difference from the verification data does not change over time or the data which changes over time in the same manner as the clocking data, as the verification data. The external device 200 can verify the clocking data read out from the circuit device 100 by using the verification data.

In addition, in this exemplary embodiment, write access through the interface unit 60 is restricted or prohibited for the verification data generation unit 40.

Specifically, the verification data generation unit 40 includes a storage unit (for example, a register, a memory, or the like) which stores the verification data. The verification data can be read out from the storage unit of the verification data generation unit 40 through the interface unit 60 from the outside of the circuit device 100, but the writing of data in the storage unit is restricted or prohibited. The restriction of the write access means that the writing of any data is prohibited and only the writing (or setting) of specific data is allowed. For example, only the reset of the verification data to "0" is allowed. The prohibition of the write access means that the rewriting of the verification data is prohibited. The restriction or prohibition of the write access can be realized, for example, by a configuration in which data cannot be transmitted to the storage unit from the interface unit 60 without connecting an output of the interface unit 60 and an input (for example, a write port of the memory) of the storage unit to each other. In a case where the writing of the specific data is allowed, a configuration may be adopted in which the specific data is written in the storage unit, for example, in a case where a control signal (for example, a command, a reset signal, or the like) for the writing is input.

In this manner, the write access to the verification data generation unit 40 through the interface unit 60 is restricted or prohibited, and thus it is possible to reduce a concern that the verification data is rewritten (falsified). Thereby, the reliability of the verification data read out by the external device 200 is improved, and thus it is possible to verify the clocking data with high reliability by using the verification data.

In addition, in this exemplary embodiment, the verification data generation unit 40 includes a counter (for example, a counter 42 of FIG. 7) which counts clock signals based on the oscillation signal. The verification data is data based on a counted value of the counter.

As described above, the clocking unit 30 measures a time by counting clock signals in cycles of one second which are obtained by performing frequency division of the oscillation signal, and thus it is possible to convert the clocking data into a time elapsed from a reference time (reference date and time). The elapsed time and the counted value of the counter are counted based on the same oscillation signal and thus can be compared with each other. For example, in a case where the counter counts the clock signals in cycles of one second in the same manner as the clocking data, a difference between a value obtained by converting the clocking data into the number of elapsed seconds (for example, a Unix time) and the counted value does not change over time. Alternatively, in a case where the counter counts the clock signals in cycles of one minute, a difference between a value obtained by converting the clocking data into the number of elapsed minutes (the number of elapsed minutes) and the counted value does not change over time. The verification data based on the counted value of the counter is output, and thus the external device 200 can verify the clocking data.

Specifically, the verification data generation unit 40 outputs the counted value of the counter as verification data.

A difference between the counted value and the value obtained by converting the clocking data into an elapsed time changes when the clocking data is fraudulently written. For this reason, the counted value of the counter is output as verification data, and thus the external device 200 can verify the clocking data. That is, the external device 200 compares a difference calculated from clocking data and verification data which are readout during the initialization of the circuit device 100, or the like with a difference calculated from clocking data and verification data which are read out during the setting of a time (restart-up) of the system, and thus it is possible to determine that there is a possibility of fraudulent rewriting being performed in a case where the differences are not consistent with each other.

Alternatively, the verification data generation unit 40 may output a difference between the counted value of the counter and a value obtained by converting the clocking data into a time elapsed from a reference time as verification data.

For example, in a case where the counter counts clock signals in cycles of one second in the same manner as the clocking data, the verification data generation unit 40 outputs a difference between the counted value of the counter and a value obtained by converting the clocking data into the number of elapsed seconds (for example, a Unix time) as verification data. Alternatively, in a case where the counter counts the clock signals in cycles of one minute, the verification data generation unit 40 outputs a difference between a value obtained by converting the clocking data into the number of elapsed minutes and the counted value as verification data.

In this manner, the verification data does not change over time as long as the clocking data is not fraudulently rewritten. For this reason, the external device 200 can verify the clocking data based on the verification data. That is, the external device 200 compares verification data which is read out during the initialization of the circuit device 100, or the like with verification data which is read out during the setting of a time (restart-up) of the system, and thus it is possible to determine that there is a possibility of fraudulent rewriting being performed in a case where the pieces of verification data are not consistent with each other.

In addition, in this exemplary embodiment, the verification data generation unit 40 includes a second clocking unit (for example, a second clocking unit 41 of FIG. 4) which generates second clocking data based on an oscillation signal. The verification data is data based on the second clocking data.

In this manner, the clocking data generated by the clocking unit 30 and the second clocking data generated by the verification data generation unit 40 are clocked based on the same oscillation signal and thus can be compared with each other. For example, the second clocking data is generated based on the clock signals in cycles of one second in the same manner as the clocking data, and a difference between the clocking data and the second clocking data does not change over time. Verification data based on the second clocking data is output, and thus the external device 200 can verify the clocking data.

Specifically, the verification data generation unit 40 outputs the second clocking data as verification data.

A difference between the clocking data output by the clocking unit 30 and the second clocking data output by the verification data generation unit 40 changes when the clocking data is fraudulently rewritten. For this reason, the second clocking data is output as the verification data, and thus the external device 200 can verify the clocking data. That is, the external device 200 compares a difference calculated from clocking data and verification data which are read out during the initialization of the circuit device 100, or the like with a difference calculated from clocking data and verification data which are read out during the setting of a time (restart-up) of the system, and thus it is possible to determine that there is a possibility of fraudulent rewriting being performed in a case where the differences are not consistent with each other. The external device 200 may perform verification based on, for example, a difference in second precision (difference in year, month, day, hour, minute, and second) or may perform verification based on a difference in minute precision (difference in year, month, day, hour, and minute).

Alternatively, the verification data generation unit 40 may output a difference between the clocking data and the second clocking data as verification data.

For example, the verification data generation unit 40 outputs a difference in second precision (difference in year, month, day, hour, minute, and second) between the clocking data and the second clocking data. Alternatively, the verification data generation unit outputs a difference in minute precision (difference in year, month, day, hour, and minute) between the clocking data and the second clocking data.

In this manner, the verification data changes when the clocking data is fraudulently rewritten. For this reason, the external device 200 can verify the clocking data based on the verification data. That is, the external device 200 compares verification data which is read out during the initialization of the circuit device 100, or the like with verification data which is read out during the setting of a time (restart-up) of the system, and thus it is possible to determine that there is a possibility of fraudulent rewriting being performed in a case where the pieces of verification data are not consistent with each other.

In addition, in this exemplary embodiment, the clocking unit 30 performs a counting operation based on clock signals obtained by performing frequency division of an oscillation signal to thereby generate clocking data. The verification data generation unit 40 performs a counting operation based on clock signals obtained by performing frequency division of an oscillation signal having the same frequency as that of the clock signal to thereby generate verification data.

Specifically, the clocking unit 30 and the verification data generation unit 40 perform a counting operation based on clock signals in cycles of one second (frequency of 1 Hz) which are obtained by performing frequency division of the oscillation signal. The counting operation is, for example, a counting operation of the above-described counter, or is a clocking operation (counting operation for generating clocking data) of the above-described second clocking unit.

In this manner, the clocking data and the verification data (for example, the counted value of the counter and the second clocking data of the second clocking unit) are generated based on clock signals which are generated from the same source oscillation (oscillation signal) and have the same frequency. Thereby, the clocking data and the verification cation data have a value changing by one count (one second) per second, and a difference therebetween is maintained constant.

In addition, in this exemplary embodiment, the clocking unit 30 may perform a counting operation based on first clock signals having a first frequency and obtained by performing frequency division of an oscillation signal to thereby generate clocking data. The verification data generation unit 40 may perform a counting operation based on second clock signals having a second frequency lower than the first frequency and obtained by performing frequency division of an oscillation signal to thereby generate verification data.

Specifically, the clocking unit 30 performs a counting operation based on clock signals in cycles of one second (frequency of 1 Hz) which are obtained by performing frequency division of an oscillation signal. The verification data generation unit 40 performs a counting operation based on clock signals, obtained by performing frequency division of an oscillation signal, in cycles (frequency lower than 1 Hz) which are longer than cycles of one second. For example, the counting operation is performed based on clock signals in cycles of 10 seconds (1/10 Hz) or in cycles of one minute (1/60 Hz). The counting operation is, for example, a counting operation of the above-described counter, or is a clocking operation (counting operation for generating clocking data) of the above-described second clocking unit.

In this manner, clocking data and verification data (for example, the counted value of the counter and the second clocking data of the second clocking unit) are generated based on clock signals which are generated from the same source oscillation (oscillation signal) and have different frequencies. In this case, a difference between data obtained by dividing the clocking data in a frequency ratio and the verification data is maintained constant. For example, in a case where the verification data is generated based on clock signals in cycles of one minute, the division of the clocking data in a frequency ratio of 60 results in the clocking data based on minute precision, and thus both the data and the verification data have a value change by one count (one minute) per minute, and a difference therebetween is maintained constant. The external device 200 can verify the clocking data based on the difference.

In this exemplary embodiment, the verification data is generated based on the second clock signal having a frequency lower than that of the first clock signal for generating the clocking data, and thus it is possible to reduce the data size of the verification data. Thereby, the data size of the difference between the clocking data and the verification data is reduced, and thus it is possible to reduce the data size of the memory and a processing load.

Meanwhile, the above-described operations of the circuit device 100 (real-time clocking device) and the system including the circuit device 100 can be executed as a method of verifying clocking data which is output by the real-time clocking device.

That is, the real-time clocking device (real-time clocking device including the circuit device 100 and the resonator XTAL) includes the clocking unit 30 that generates clocking data based on an oscillation signal and the verification data generation unit 40 that generates verification data for verifying the clocking data based on the oscillation signal. A verification method is a method of performing a process of setting a present time (rewriting of clocking data) on the clocking unit 30, reading out the clocking data and the verification data from the real-time clocking device, and performing a process of verifying the clocking data based on the read-out clocking data and verification data.

This verification method is executed by, for example, the external device 200. That is, the processing unit 210 of the external device 200 performs a process of setting a present time (rewriting of clocking data) on the clocking unit 30 through the interface unit 220 (for example, S3 in FIG. 2), the processing unit 210 reads out the clocking data and the verification data from the real-time clocking device through the interface unit 220 (S11 in FIG. 3), and the processing unit 210 performs a process of verifying the clocking data based on the read-out clocking data and verification data (S13 to S15 in FIG. 3).

2. OPERATION

Figure 2:
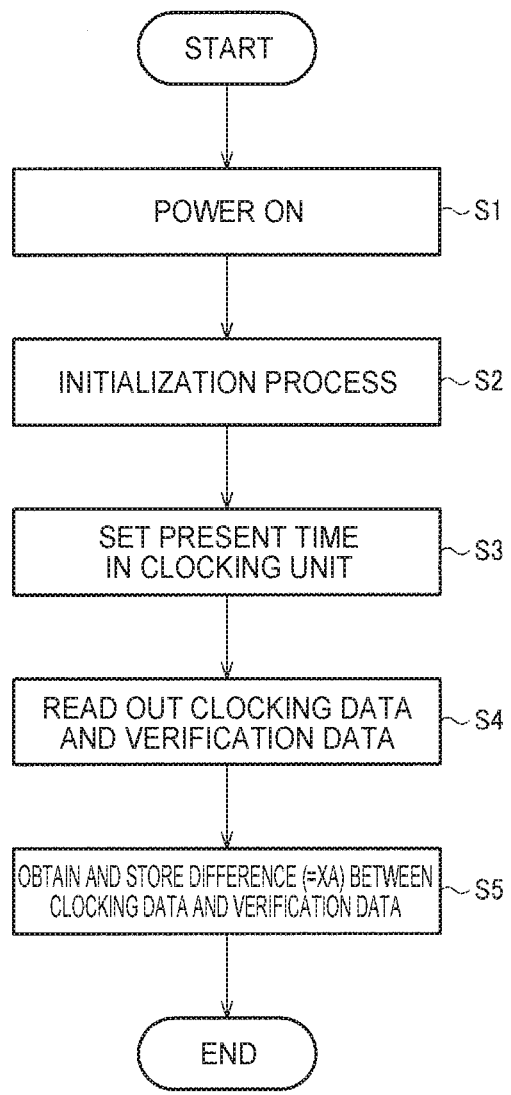
FIG. 2 is a flow chart illustrating a procedure of operations of the system including the circuit device according to this exemplary embodiment.
Figure 3:
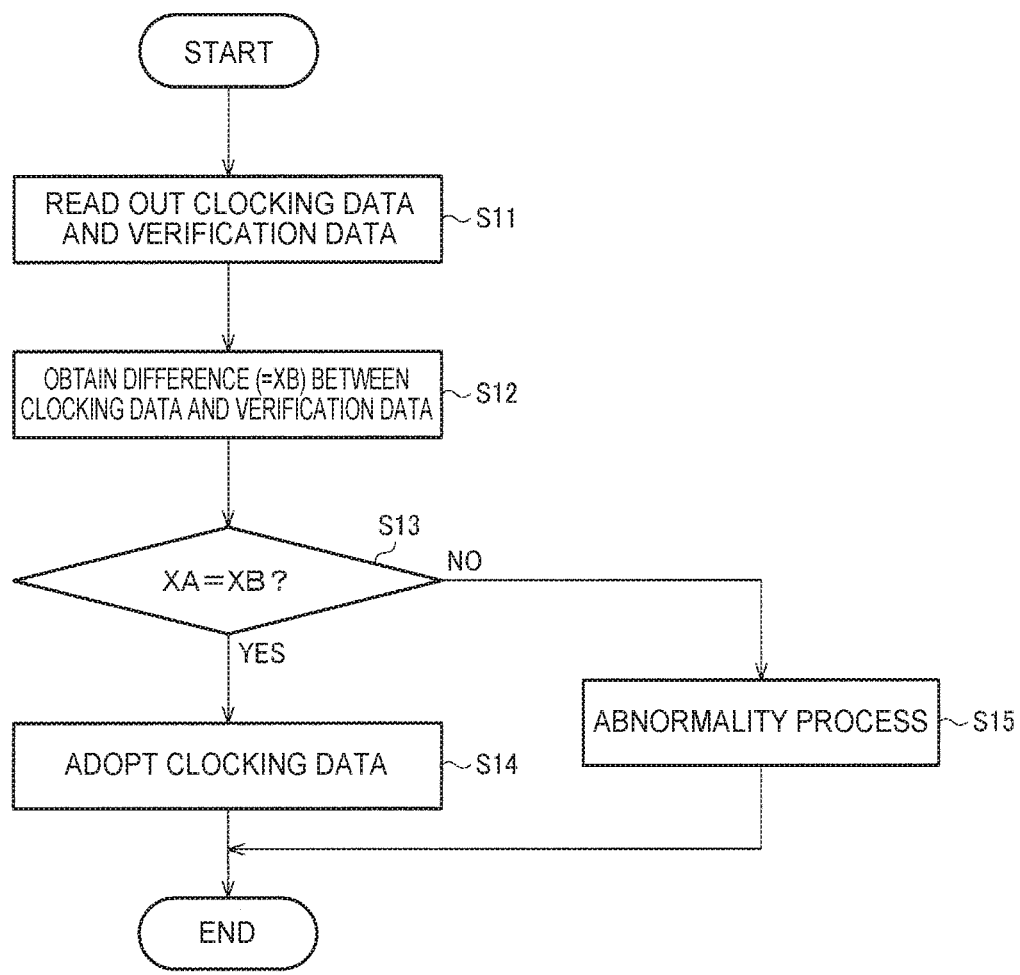
FIG. 3 is a flow chart illustrating a procedure of operations of the system including the circuit device according to this exemplary embodiment.

FIGS. 2 and 3 are flow charts illustrating a procedure of operations of the system including the circuit device 100 (real-time clocking device) according to this exemplary embodiment.

As illustrated in FIG. 2, when the power supply of the system is first turned on (step S1), the processing unit 210 of the external device 200 has access to the circuit device 100 through the interface unit 220 to perform a process of initializing the circuit device 100. Specifically, step S1 is a step in which the power supply of the real-time clocking device is first turned on, and subsequently, the real-time clocking device performs clocking by the backup power supply even when the main power supply of the system is turned off. The initialization process is a process of initializing verification data. For example, the verification data is initialized to a predetermined value (for example, "0"). In addition, in the initialization process, various operation settings of the circuit device 100 are performed.

Next, the processing unit 210 sets a present time (an initial value of clocking data) in the clocking unit 30 of the circuit device 100 through the interface unit 220 (S3). The clocking unit 30 clocks the present time as an initial value to generate clocking data. Next, the processing unit 210 reads out the clocking data from the clocking unit 30 through the interface unit 220, and reads out the verification data from the verification data generation unit 40 (S4). Next, the processing unit 210 obtains a difference between the read-out clocking data and verification data and stores the obtained difference in the storage unit. The difference which is first obtained and stored in the storage unit is referred to as XA. The storage unit may be a memory (for example, non-volatile memory) or the like included in the external device 200, or may be a memory, a magnetic storage device, or the like which is provided within the system separately from the external device 200.

Timings at which the verification data is initialized in step S2, the present time (initial value) is set in step S3, and the clocking data and the verification data are readout in step S4 are arbitrary. For example, when steps up to step S4 are executed within one second after the verification data is initialized in step S2, the read-out verification data and the clocking data are initial values, and a difference therebetween is set to be XA. Subsequently, it is expected that a difference between the verification data and the clocking data is the same as XA. On the other hand, in a case where steps up to step S4 are not executed within one second, the read-out clocking data and the verification data are not initial values, but a difference therebetween is set to be XA. In this case, the clocking data and the verification data are generated based on the same source oscillation, and thus it is expected that a difference therebetween does not change from the first XA.

FIG. 3 is a flow chart when a time is read out from the real-time clocking device in a case where the main power supply of the system changes from a turn-off state to a turn-on state in a state where the real-time clocking device has been already operated, a case where a time of the system which is presently used is corrected, or the like.

As illustrated in FIG. 3, the processing unit 210 of the external device 200 reads out the clocking data from the clocking unit 30 of the circuit device 100 through the interface unit 220, and reads out the verification data from the verification data generation unit 40 (S11). Next, the processing unit 210 obtains a difference between the read-out clocking data and the verification data (S12). This difference is referred to as XB. Next, the processing unit 210 determines whether or not the difference XA stored in the storage unit in step S5 of FIG. 2 and the difference XB obtained this time are the same as each other (S13). In a case where a relationship of XA=XB is established, the processing unit 210 determines that the clocking data is not fraudulently rewritten, and adopts the read-out clocking data (S14). For example, the time of the system is updated based on the clocking data. On the other hand, in a case where the relationship of XA=XB is not established, the processing unit 210 determines that there is a possibility of the clocking data being fraudulently rewritten, and performs an abnormality process. For example, the time of the system is updated based on time information acquired from a network or the like rather than the clocking data. Alternatively, reset processing of the real-time clocking device (circuit device 100), or the like is performed.

3. DETAILED CONFIGURATION EXAMPLE

Figure 4:
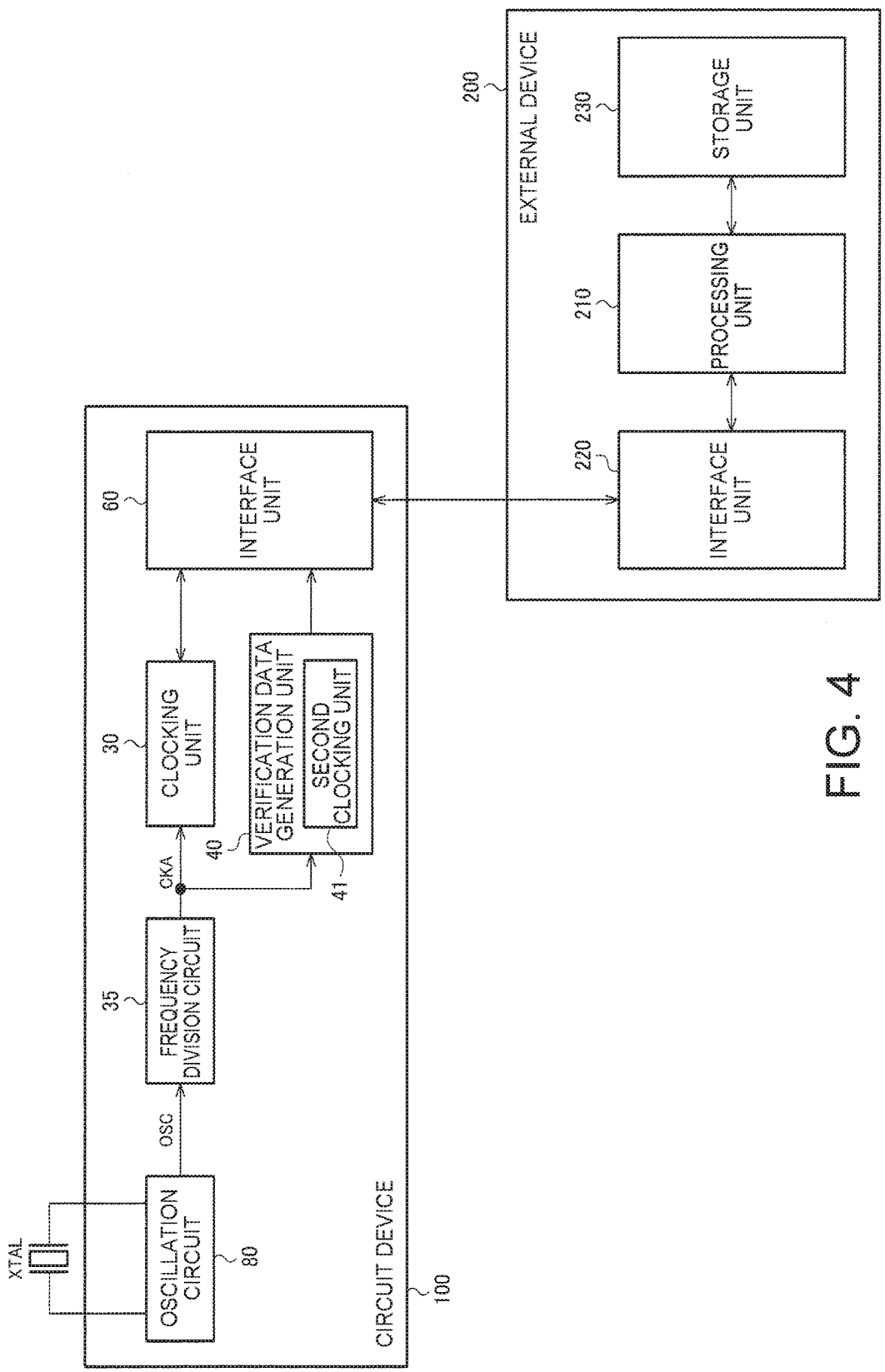
FIG. 4 illustrates a first detailed configuration example of the circuit device according to this exemplary embodiment and the system including the circuit device.

FIG. 4 illustrates a first detailed configuration example of the circuit device according to this exemplary embodiment and the system including the circuit device. In FIG. 4, the circuit device 100 further includes a frequency division circuit 35 (frequency division unit). In addition, the verification data generation unit 40 includes a second clocking unit 41 (second clocking circuit). In addition, the external device 200 further includes a storage unit 230. Meanwhile, the storage unit 230 may be provided as a component separate from the external device 200. Here, the same components as the components described in FIG. 1 are denoted by the same reference numerals and signs, and a description thereof will be appropriately omitted.

The frequency division circuit 35 performs frequency division of an oscillation signal OSC received from the oscillation circuit 80, and outputs clock signals CKA in cycles of one second (frequency of 1 Hz) to the clocking unit 30 and the verification data generation unit 40. The clocking unit 30 and the second clocking unit 41 perform clocking (counting operation) based on the clock signals CKA to generate piece of clocking data of year, month, day, hour, minute, and second.

FIGS. 5 and 6 illustrate an example of a verification process in the first detailed configuration example. FIG. 5 illustrates a process of obtaining the first difference XA (S4 and S5 in FIG. 2), and FIG. 6 illustrates a process of obtaining the difference XB during verification (S11 and S12 in FIG. 3).

As illustrated in FIG. 5, it is assumed that 2016 Dec. 1 10:20:30 which is an initial value of clocking data is set in the clocking unit 30, and 2000 Jan. 1 0:00:00 which is an initial value of second clocking data is set in the second clocking unit 41. The processing unit 210 of the external device 200 reads out the clocking data and the second clocking data. In this example, the second clocking data is verification data. The processing unit 210 converts the clocking data and the second clocking data into Unix times. The Unix time is the number of seconds elapsed from 1970 Jan. 1 0:00:00 which is Coordinated Universal Time (UTC). The processing unit 210 obtains a difference between the clocking data and the second clocking data which are converted into the Unix times as XA, and stores the difference XA in the storage unit 230. In the example of FIG. 5, XA is 533902830.

As illustrated in FIG. 6, the clocking data of the clocking unit 30 is 2017 Jan. 1 10:20:30 after one month from FIG. 5, and the second clocking data of the second clocking unit 41 is 2000 Feb. 1 0:00:00. At this time, it is assumed that the processing unit 210 of the external device 200 reads out the clocking data and the verification data. The processing unit 210 converts the clocking data and the second clocking data into Unix times, and obtains a difference between the clocking data and the second clocking data which are converted into the Unix times as XB. In the example of FIG. 6, XB is 533902830. The processing unit 210 compares the difference XB with the difference XA which is read out from the storage unit 230. FIG. 6 illustrates an example in a case where fraudulent rewriting of the clocking data is not performed, and a relationship of XB=XA is established. This is because the clocking data and the second clocking data are counted by exactly the same number of seconds for one month based on the same source oscillation, which does not result in an error. In a case where the relationship of XB=XA is not established, it is possible to determine that there is a possibility that fraudulent rewriting of the clocking data is performed.

Meanwhile, as a modification example, the verification data generation unit 40 may obtain a difference (XA in FIG. 5 and XB in FIG. 6) between the clocking data of the clocking unit 30 and the second clocking data of the second clocking unit 41, and may output the difference as verification data. In this case, the processing unit 210 of the external device 200 stores the difference XA which is verification data in the storage unit 230, and compares the difference XB being verification data which is read out thereafter with the difference XA which is read out from the storage unit 230 to verify the clocking data.

Figure 7:
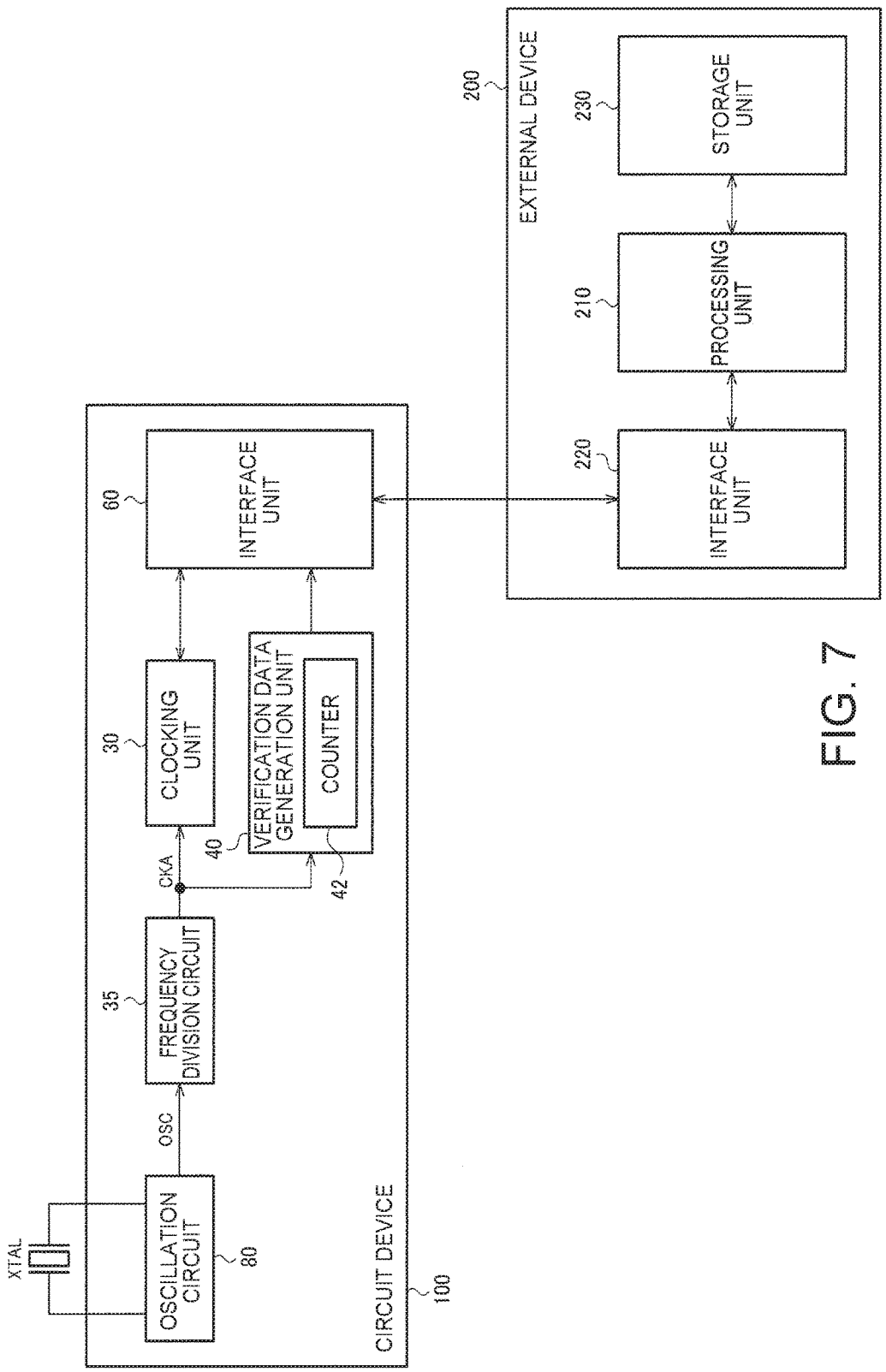
FIG. 7 illustrates a second detailed configuration example of the circuit device according to this exemplary embodiment and the system including the circuit device.

FIG. 7 illustrates a second detailed configuration example of the circuit device according to this exemplary embodiment and the system including the circuit device. In FIG. 7, the verification data generation unit 40 includes the counter 42. Here, the same components as the components described in FIG. 1 and FIG. 4 are denoted by the same reference numerals and signs, and a description thereof will be appropriately omitted.

The clocking unit 30 performs clocking (counting operation) based on the clock signals CKA in cycles of one second which are output from the frequency division circuit 35 to generate piece of clocking data of year, month, day, hour, minute, and second. The counter 42 performs a counting operation based on the same clock signals CKA to increment the counted value every second.

FIGS. 8 and 9 illustrate an example of a verification process in the second detailed configuration example. FIG. 8 illustrates a process of obtaining the first difference XA (S4 and S5 in FIG. 2), and FIG. 9 illustrates a process of obtaining the difference XB during verification (S11 and S12 in FIG. 3).

As illustrated in FIG. 8, it is assumed that 2016 Dec. 1 10:20:30 which is an initial value of clocking data is set in the clocking unit 30. It is assumed that the counter 42 is reset to an initial value "0". The processing unit 210 of the external device 200 reads out the clocking data and the counted value. In this example, the counted value is verification data. The processing unit 210 converts the clocking data into a Unix time. The counted value is regarded as the Unix time as it is. The processing unit 210 obtains a difference between the clocking data converted into the Unix time and the counted value as XA, and stores the difference XA in the storage unit 230. In the example of FIG. 8, XA is 1480555230.

As illustrated in FIG. 9, the clocking data of the clocking unit 30 is 2017 Jan. 1 10:20:30 after one month from FIG. 8, and the counted value of the counter 42 is 2678400. At this time, it is assumed that the processing unit 210 of the external device 200 reads out the clocking data and the verification data. The processing unit 210 converts the clocking data into a Unix time, and obtains a difference between the clocking data converted into the Unix time and the counted value as XB. In the example of FIG. 9, XB is 1480555230. The processing unit 210 compares the difference XB with the difference XA which is read out from the storage unit 230. FIG. 9 illustrates an example in a case where fraudulent rewriting of the clocking data is not performed, and a relationship of XB=XA is established. This is because the clocking data and the counted value are counted by exactly the same number of seconds for one month based on the same source oscillation, which does not result in an error. In a case where the relationship of XB=XA is not established, it is possible to determine that there is a possibility that fraudulent rewriting of the clocking data is performed.

Meanwhile, as a modification example, the verification data generation unit 40 may obtain a difference (XA in FIG. 8 and XB in FIG. 9) between a value obtained by converting the clocking data of the clocking unit 30 into a Unix time and the counted value of the counter 42, and may output the difference as verification data. In this case, the processing unit 210 of the external device 200 stores the difference XA which is verification data in the storage unit 230, and compares the difference XB being verification data which is read out thereafter with the difference XA which is readout from the storage unit 230 to verify the clocking data.

Figure 10:
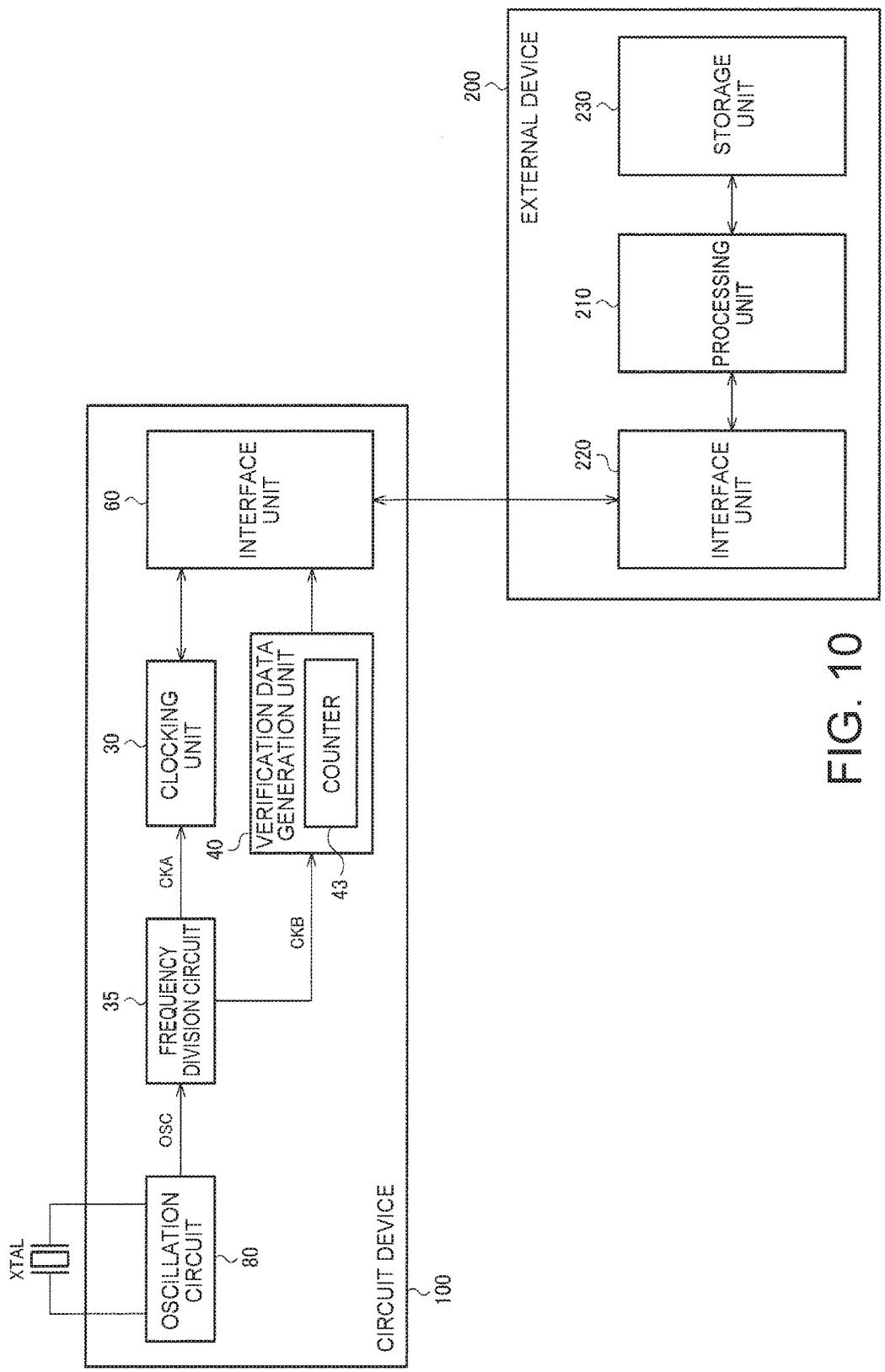
FIG. 10 illustrates a third detailed configuration example of the circuit device according to this exemplary embodiment and the system including the circuit device.

FIG. 10 illustrates a third detailed configuration example of the circuit device according to this exemplary embodiment and the system including the circuit device. In FIG. 10, the verification data generation unit 40 includes a counter 43. Here, the same components as the components described in FIGS. 1, 4, and 7 are denoted by the same reference numerals and signs, and a description thereof will be appropriately omitted.

The frequency division circuit 35 performs frequency division of an oscillation signal OSC received from the oscillation circuit 80, and outputs clock signals CKA in cycles of one second (frequency of 1 Hz) to the clocking unit 30. In addition, the frequency division circuit 35 performs frequency division of the oscillation signal OSC received from the oscillation circuit 80, and outputs clock signals CKB in cycles of one minute (frequency $\frac{1}{60}$ Hz) to the verification data generation unit 40. The clocking unit 30 performs clocking (counting operation) based on the clock signals CKA in cycles of one second which are output from the frequency division circuit 35 to generate piece of clocking data of year, month, day, hour, minute, and second. The counter 43 performs a counting operation based on the clock signals CKB in cycles of one minute which are output from the frequency division circuit 35 to increment the counted value every minute.

FIGS. 11 and 12 illustrate an example of a verification process in the second detailed configuration example. FIG. 11 illustrates a process of obtaining the first difference XA (S4 and S5 in FIG. 2), and FIG. 12 illustrates a process of obtaining the difference XB during verification (S11 and S12 in FIG. 3).

As illustrated in FIG. 11, it is assumed that 2016 Dec. 1 10:20:30 which is an initial value of clocking data is set in the clocking unit 30. It is assumed that the counter 42 is reset to an initial value "0". The processing unit 210 of the external device 200 reads out the clocking data and the counted value. In this example, the counted value is verification data. The processing unit 210 converts the clocking data into a Unix time, and divides the converted Unix time by 60. The counted value is regarded as a value obtained by dividing the Unix time by 60 as it is. The processing unit 210 obtains a difference between the clocking data converted into the value obtained by dividing the Unix time by 60 and the counted value as XA, and stores the difference XA in the storage unit 230. In the example of FIG. 11, XA is 24675921.

As illustrated in FIG. 12, the clocking data of the clocking unit 30 is 2017 Jan. 1 10:20:30 after one month from FIG. 11, and the counted value of the counter 43 is 44640. At this time, it is assumed that the processing unit 210 of the external device 200 reads out the clocking data and the verification data. The processing unit 210 converts the clocking data into a value obtained by dividing the Unix time by 60, and obtains a difference between the clocking data converted into the value obtained by dividing the Unix time by 60 and the counted value as XB. In the example of FIG. 12, XB is 24675921. The processing unit 210 compares the difference XB with the difference XA which is readout from the storage unit 230. FIG. 12 illustrates an example in a case where fraudulent rewriting of the clocking data is not performed, and a relationship of XB=XA is established. This is because the clocking data and the counted value are counted by exactly the same number of minutes for one month based on the same source oscillation, which does not result in an error. In a case where the relationship of XB=XA is not established, it is possible to determine that there is a possibility that fraudulent rewriting of the clocking data is performed.

Meanwhile, as a first modification example, the verification data generation unit 40 may obtain a difference (XA in FIG. 11 and XB in FIG. 12) between a value obtained by converting the clocking data of the clocking unit 30 into the value obtained by dividing the Unix time by 60 and the counted value of the counter 42, and may output the difference as verification data. In this case, the processing unit 210 of the external device 200 stores the difference XA which is verification data in the storage unit 230, and compares the difference XB being verification data which is read out thereafter with the difference XA which is read out from the storage unit 230 to verify the clocking data.

In addition, as a second modification example, the verification data generation unit 40 includes a third clocking unit that generates third clocking data based on the clock signal CKB, and may output verification data based on the third clocking data. The third clocking data is clocking data of minute precision (clocking data of year, month, day, hour, and minute). For example, in a case where the third clocking data is output as verification data, the processing unit 210 of the external device 200 compares year, month, day, hour, and minute of the clocking data which is read out from the clocking unit 30 with the third clocking data to verify the clocking data.

4. MODIFICATION EXAMPLE IN WHICH DIFFERENCE IS STORED IN CIRCUIT DEVICE

Meanwhile, in the above description, a description has been given of an example of a case where a difference between clocking data and verification data is stored in the storage unit provided outside the real-time clocking device, but the difference may be stored in a storage unit provided inside the real-time clocking device (circuit device 100) as a modification example.

For example, the circuit device 100 includes a memory (for example, a one-time PROM) in which writing can be performed only once, and a difference (the difference XA in FIG. 2) which is first obtained is stored in the memory. The external device 200 reads out the clocking data, the verification data, and the difference stored in the memory of the circuit device 100, and compares a difference between the clocking data and the verification data with the difference which is read out from the memory of the circuit device 100 to verify the clocking data.

5. DETAILED CONFIGURATION EXAMPLE OF CIRCUIT DEVICE

Figure 13:
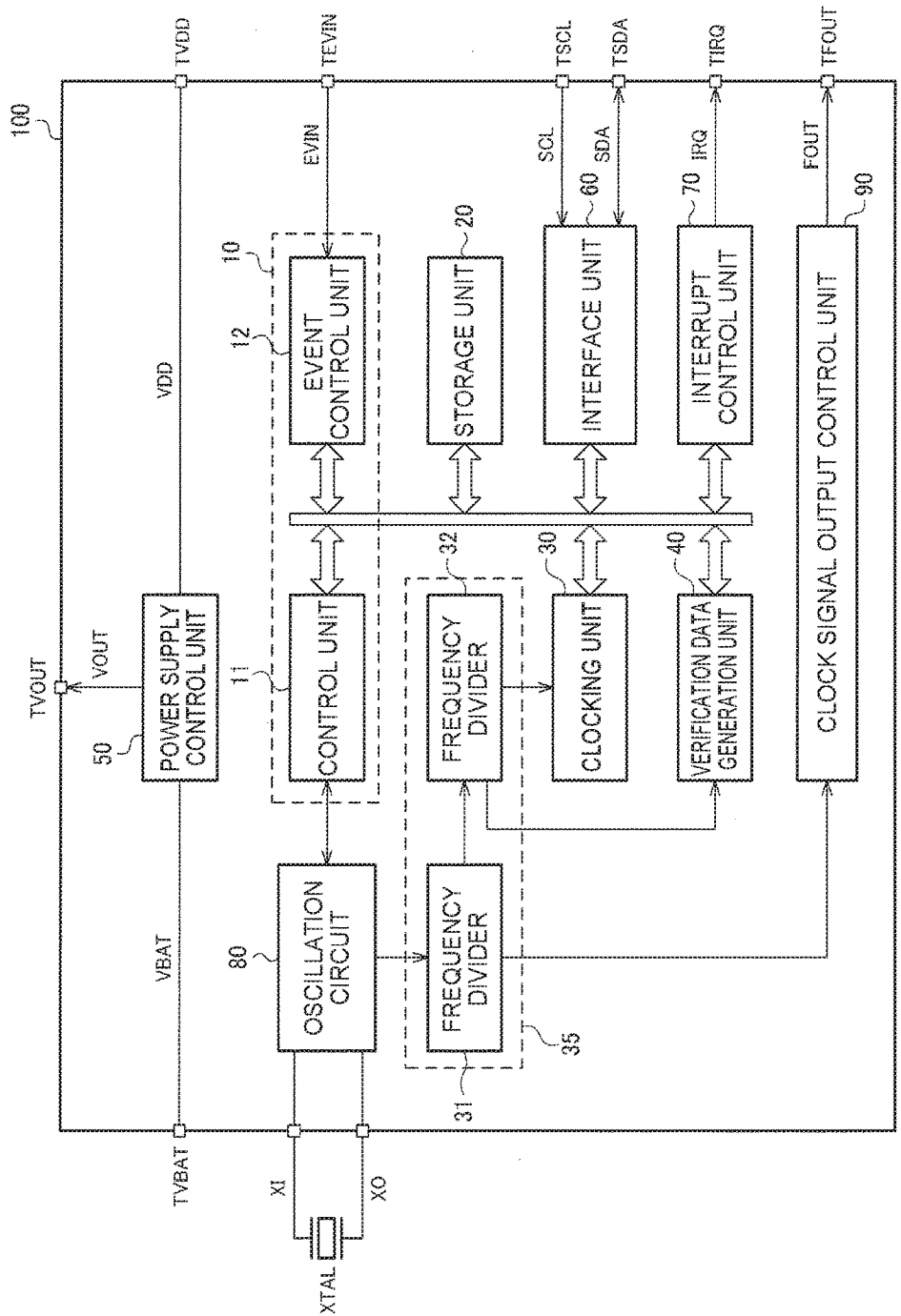
FIG. 13 illustrates a detailed configuration example of the circuit device according to this exemplary embodiment.

FIG. 13 illustrates a detailed configuration example of the circuit device 100 according to this exemplary embodiment. The circuit device 100 includes a processing unit 10 (processing circuit), a storage unit 20 (memory), a clocking unit 30 (clocking circuit), a frequency division circuit 35, and a verification data generation unit 40 (verification data generation circuit). In addition, the circuit device 100 includes a power supply control unit 50 (power supply control circuit), an interface unit 60 (interface circuit), an interrupt control unit 70 (interrupt control circuit), an oscillation circuit 80, a clock signal output control unit 90 (clock signal output circuit), and terminals TVBAT, TVOUT, TVDD, TEVIN, TSCL, TSDA, TIRQ, TFOUT, XI, and XO. Meanwhile, the same components as the components described in FIG. 1 and the like are denoted by the same reference numerals and signs, and a description thereof will be appropriately omitted. Here, the circuit device is not limited to the configuration of FIG. 13, and various modifications such as the omission of a portion of the components and the addition of other components can be made thereto.

A backup power supply voltage VBAT supplied from a backup power supply is input to the terminal TVBAT. The backup power supply is, for example, a primary battery, a secondary battery, a super capacitor, or the like. A main power supply voltage VDD supplied from the main power supply is input to the terminal TVDD. The power supply control unit 50 selects the main power supply voltage VDD or the backup power supply voltage VBAT, and supplies the selected voltage to each unit of the circuit device 100 as a voltage VOUT (internal power supply voltage of the circuit device 100). Specifically, the power supply control unit selects the main power supply voltage VDD in a case where the main power supply voltage VDD exceeds a predetermined voltage, and selects the backup power supply voltage VBAT in a case where the main power supply voltage VDD is less than the predetermined voltage. For example, the power supply control unit 50 includes a comparator that compares the main power supply voltage VDD and the predetermined voltage with each other, and an analog switch circuit of which the turn-on and turn-off are controlled based on an output of the comparator.

The processing unit 10 includes a control unit 11 that controls each unit of the circuit device 100, and an event control unit 12 that performs an event control process.

Specifically, a signal EVIN indicating whether or not an event (external event) has occurred is input to the event control unit 12 through the terminal TEVIN from the outside of the circuit device 100. In a case where the signal EVIN changes from a non-active state to an active state, the event control unit 12 notifies the control unit 11 of the change. In a case where the control unit 11 receives the notification, the control unit writes a time stamp (clocking data) of the event in the storage unit 20. The storage unit 20 is a RAM such as an SRAM.

The oscillation circuit 80 is connected to one end of the resonator XTAL through the terminal XI and is connected to the other end of the resonator XTAL through the terminal XO to drive and oscillate the resonator XTAL. The oscillation circuit 80 includes an amplification circuit that drives, for example, the resonator XTAL to generate an oscillation signal, and a variable capacitance circuit that adjusts an oscillation frequency of the oscillation signal. Alternatively, the oscillation circuit 80 may further include a temperature sensor, and a temperature compensation circuit that compensates for (suppresses) a temperature characteristic of the oscillation frequency based on an output voltage of the temperature sensor.

The resonator XTAL is a piezoelectric vibrator such as a quartz crystal vibrator. Alternatively, the resonator XTAL may be a resonator (an electromechanical resonator or an electrical resonance circuit). Examples of the resonator XTAL to be adopted may include a piezoelectric vibrator, a Surface Acoustic Wave (SAW) resonator, a Micro Electro Mechanical Systems (MEMS) vibrator, and the like. Examples of a substrate material of the resonator XTAL to be used may include a piezoelectric material such as piezoelectric single crystal, for example, quartz, lithium tantalate, and lithium niobate, piezoelectric ceramics, for example, lead zirconate titanate, a silicon semiconductor material, and the like. As excitation means of the resonator XTAL, excitation means based on a piezoelectric effect may be used, or electrostatic driving based on a Coulomb force may be used.

The frequency division circuit 35 includes a frequency divider 31 that performs frequency division of the oscillation signal generated by the oscillation circuit 80 to generate a clock signal having a predetermined frequency (for example, 1 kHz), and a frequency divider 32 that performs frequency division of the clock signal generated by the frequency divider 31 to generate a clock signal of 1 Hz (or 1 Hz and 1/60 Hz).

The clocking unit 30 counts clock signals of 1 Hz from the frequency divider 32 to generate clocking data. For example, the clocking unit 30 includes a counter that counts clock signals of 1 Hz, and a conversion unit that converts a counted value of the counter into clocking data (data of year, month, day, hour, minute, and second). An initial value of the clocking data is written through the interface unit 60 when the circuit device 100 (real-time clocking device) is first turned on, and the clocking data is updated per second, starting from the initial value.

The verification data generation unit 40 generates verification data based on the clock signal of 1 Hz or the clock signal of 1/60 Hz received from the frequency division circuit 35. In a case where the verification data generation unit 40 includes a second clocking unit, the second clocking unit can be configured in the same manner as the clocking unit 30. Alternatively, the verification data generation unit 40 may include a counter.

The clock signal output control unit 90 selects any one of a plurality of clock signals (the clock signals have different frequencies) based on an oscillation signal, and outputs the selected clock signal to the outside of the circuit device 100 from the terminal TFOUT as a clock signal FOUT. In addition, the clock signal output control unit 90 can also set the clock signal FOUT to be in a non-active state (a non-output state, a stop state).

The interface unit 60 performs digital interface communication between an external device and the circuit device 100. For example, the interface unit 60 is a circuit that performs serial interface communication such as an I2C system or an SPI system. FIG. 13 illustrates a case using the I2C system, and the interface unit 60 inputs and outputs a serial data signal SDA through the terminal TSDA based on a clock signal SCL which is input from the terminal TSCL.

The interrupt control unit 70 performs control for outputting an interrupt signal IRQ to an external device through the terminal TIRQ. For example, in a case where the occurrence of an event is detected by the event control unit 12, the interrupt control unit 70 sets the interrupt signal IRQ to be in an active state.

Meanwhile, the processing unit 10, the clocking unit 30, the frequency division circuit 35, the verification data generation unit 40, the interface unit 60, the interrupt control unit 70, and the clock signal output control unit 90 are constituted by a logic circuit such as a gate array.

6. REAL-TIME CLOCKING DEVICE, ELECTRONIC APPARATUS, AND VEHICLE

Figure 14:
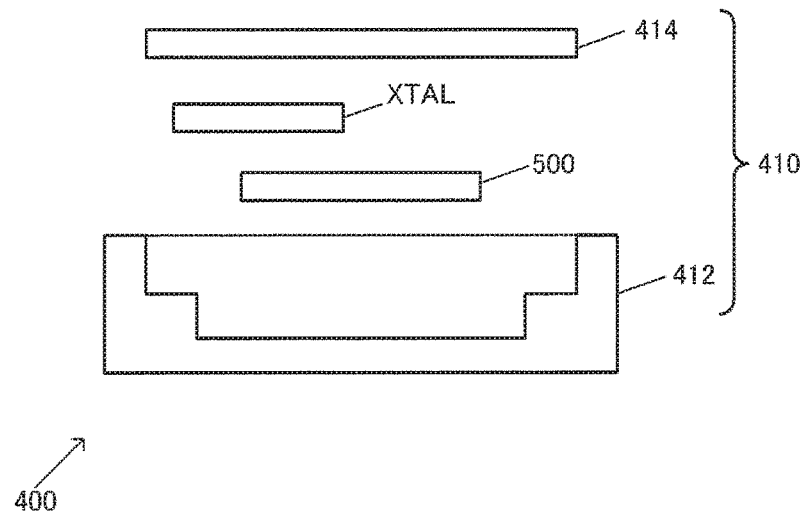
FIG. 14 illustrates a configuration example of a real-time clocking device.

FIG. 14 illustrates a configuration example of a real-time clocking device 400 including the circuit device according to this exemplary embodiment. The real-time clocking device 400 includes a circuit device 500 (corresponding to the circuit device 100 of FIG. 1 or the like), and an resonator XTAL (vibrator, vibrator element). In addition, the real-time clocking device 400 may include a package 410 that accommodates the circuit device 500 and an resonator XTAL. Meanwhile, the real-time clocking device is not limited to the configuration of FIG. 14, and various modifications such as the omission of a portion of the components and the addition of other components can be made thereto.

The package 410 includes, for example, abase portion 412 and a lid portion 414. The base portion 412 is, for example, a box-shaped member including an insulating material such as ceramic, and the lid portion 414 is, for example, a flat plate-shaped member which is bonded to the base portion 412. For example, the bottom surface of the base portion 412 is provided with an external connection terminal (external electrode) for connection to an external apparatus. The circuit device 500 and the resonator XTAL are accommodated in an inner space (cavity) formed by the base portion 412 and the lid portion 414. The circuit device 500 and the resonator XTAL are airtightly sealed in the package 410 by the lid portion 414. The circuit device 500 and the resonator XTAL are mounted within the package 410. A terminal of the resonator XTAL and a terminal (pad) of the circuit device 500 (IC) are electrically connected to each other by an internal wiring of the package 410.

Figure 15:
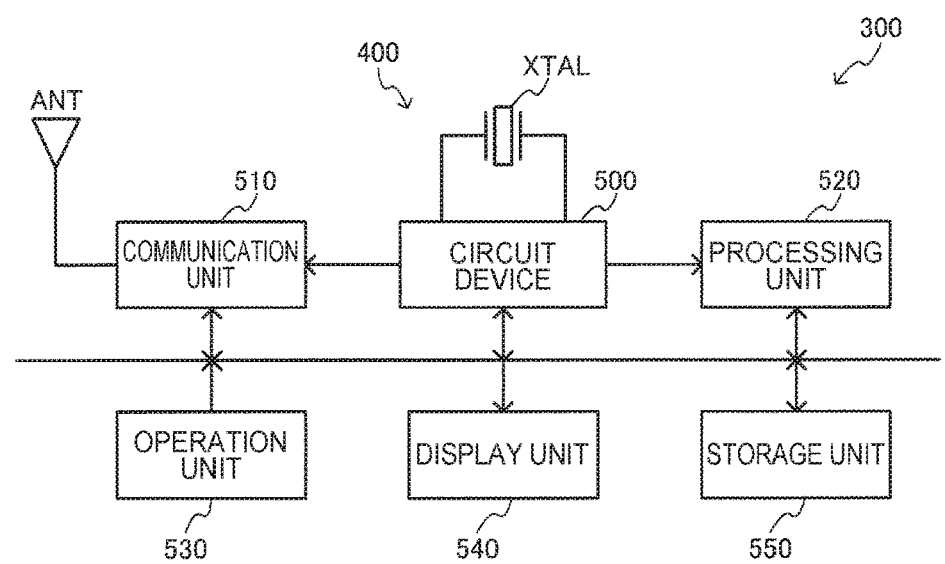
FIG. 15 illustrates a configuration example of an electronic apparatus.

FIG. 15 illustrates a configuration example of an electronic apparatus 300 including the circuit device according to this exemplary embodiment. The electronic apparatus 300 includes a circuit device 500, an resonator XTAL such as a quartz crystal vibrator, an antenna ANT, a communication unit 510 (communication device), and a processing unit 520 (processing device). In addition, the electronic apparatus may include an operation unit 530 (operation device), a display unit 540 (display device), and a storage unit 550 (memory). The real-time clocking device 400 is constituted by the resonator XTAL and the circuit device 500. Meanwhile, the electronic apparatus 300 is not limited to the configuration of FIG. 15, and various modifications such as the omission of a portion of the components and the addition of other components can be made thereto.

Examples of the electronic apparatus 300 of FIG. 15 which is to be assumed may include an on-vehicle electronic device such as an Electronic Control Unit (ECU) or a meter panel, a video apparatus such as a digital camera or a video camera, and a printing apparatus such as a printer or a multi-function printer. Alternatively, it is possible to assume various apparatuses, for example, a wearable apparatus such as a GPS-incorporated time piece, a biological information measurement apparatus (a pulse wave meter, a pedometer, or the like) or a head-mounted display device, a portable information terminal (mobile terminal) such as a smartphone, a mobile phone, a portable game device, a notebook PC, or a tablet PC, a content provision terminal that distributes a content, and a network-related apparatus such as a base station or a router.

The communication unit 510 (wireless circuit) performs a process of receiving data from the outside through the antenna ANT and transmitting data to the outside. The processing unit 520 performs control processing of the electronic apparatus 300, various digital processing of data transmitted and received through the communication unit 510, and the like. The function of the processing unit 520 can be realized by a processor such as a micro computer. The operation unit 530 is a unit for causing a user to perform an input operation, and can be realized by an operation button, a touch panel display, or the like. The display unit 540 is a unit for displaying various pieces of information, and can be realized by a display such as a liquid crystal display or an organic EL. Meanwhile, in a case where a touch panel display is used as the operation unit 530, the touch panel display can also serve as the operation unit 530 and the display unit 540. The storage unit 550 stores data, and the function thereof can be realized by a semiconductor memory such as a RAM or a ROM, a hard disk drive (HDD), or the like.

Figure 16:
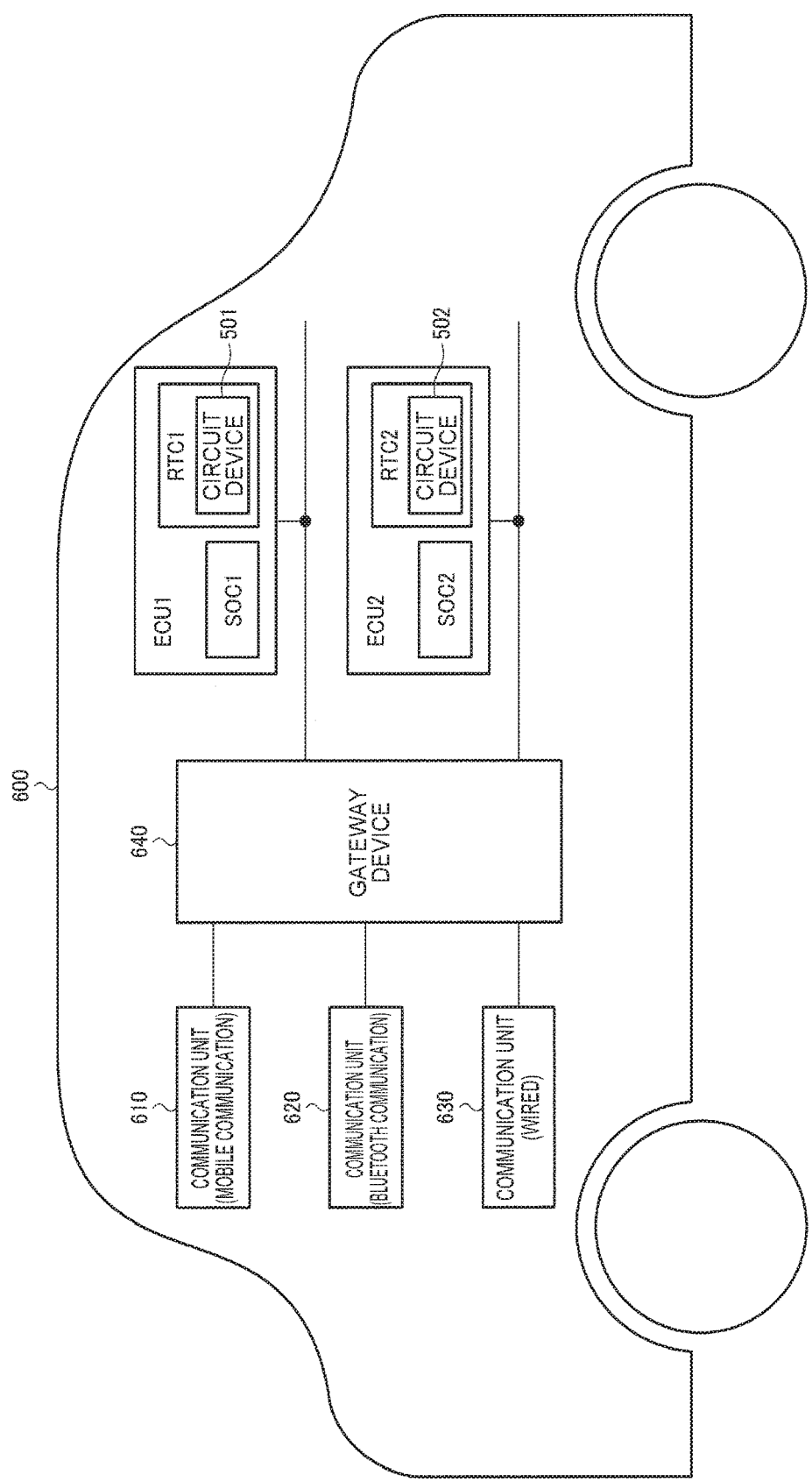
FIG. 16 illustrates a configuration example of a vehicle.

FIG. 16 illustrates an example of a vehicle including the circuit device according to this exemplary embodiment. The circuit device (real-time clocking device) according to this exemplary embodiment can be embedded in various vehicles such as a car, an airplane, a motorcycle, a bicycle, and a ship. The vehicle is an apparatus or a device that moves on the ground and in the sky and the sea by including a driving mechanism such as an engine or a motor, a steering mechanism such as a handle or a rudder, and various electronic apparatuses (on-vehicle apparatus). FIG. 16 schematically illustrates an automobile 600 as a specific example of the vehicle. The automobile 600 includes a communication unit 610 that performs mobile communication such as portable wireless communication, a communication unit 620 that performs Bluetooth (registered trademark) communication, a communication unit 630, such as a USB, which performs wired communication, a gateway device 640 that performs gateway processing of an internal network together with the communication units, and control units (control devices) ECU1 and ECU2 that are connected to the internal network. The control units ECU1 and ECU2 are control units that performs system control, such as engine control, which is related to traveling, control units that performs system control, such as an open and a close of a door, which is related to body, control units, such as car audios, which perform information processing, or the like. The control unit ECU1 includes a processing device SOC1 (external device), and a real-time clocking device RTC1 that communicates with the processing device SOC1. The real-time clocking device RTC1 includes a circuit device 501. The control unit ECU2 includes a processing device SOC2 (external device), and a real-time clocking device RTC2 that communicates with the processing device SOC2. The real-time clocking device RTC2 includes a circuit device 502. The circuit devices 501 and 502 correspond to, for example, the circuit device 100 of FIG. 1 or the like.

While this exemplary embodiment has been described in detail, one skilled in the art can easily understand that a number of modifications can be made without substantially departing from the new matters and effects of the invention. Therefore, all such modifications are included in the scope of the invention. For example, a term described at least once along with a different term having a broader meaning or the same meaning in the description or drawings can be replaced with the different term at any location in the description or drawings. In addition, all combinations of this exemplary embodiment and the modification examples are included in the scope of the invention. In addition, the configurations and operations of the circuit device, the real-time clocking device, the electronic apparatus, and the vehicle, the method of verifying clocking data, and the like are not limited to those described in this exemplary embodiment and can be modified in various ways.

The entire disclosure of Japanese Patent Application No. 2017-008029, filed Jan. 20, 2017 is expressly incorporated by reference herein.

What is claimed is:

1. A circuit device comprising:
an oscillation circuit configured to generate an oscillation signal for oscillating a resonator connected to the circuit device;
a clocking circuit configured to receive clock signals indicative of the oscillation signal and generate clocking data based on the oscillation signal, wherein the clocking data corresponds to real-time clock information indicating an elapsed time;
a verification data generation circuit configured to receive the clock signals and generate verification data for verifying the clocking data based on the oscillation signal; and
an interface circuit configured to receive the clocking data and the verification data and output the clocking data and the verification data.

2. The circuit device according to claim 1,
wherein the interface circuit is configured to restrict or prohibit write access for the verification data generation circuit.

3. The circuit device according to claim 1,
wherein the verification data generation circuit includes a counter configured to count clock signals based on the oscillation signal, and
wherein the verification data is based on a counted value of the counter.

4. The circuit device according to claim 3,
wherein the verification data generation circuit outputs the counted value as the verification data.

5. The circuit device according to claim 3,
wherein the verification data generation circuit outputs a difference between a value obtained by converting the clocking data into a time elapsed from a reference time and the counted value of the counter as the verification data.

6. The circuit device according to claim 1,
wherein the verification data generation circuit includes a second clocking circuit configured to generate second clocking data based on the oscillation signal, and
wherein the verification data is based on the second clocking data.

7. The circuit device according to claim 6,
wherein the verification data generation circuit outputs the second clocking data as the verification data.

8. The circuit device according to claim 6,
wherein the verification data generation circuit outputs a difference between the clocking data and the second clocking data as the verification data.

9. The circuit device according to claim 1,
wherein the clocking circuit performs a first counting operation based on a first clock signal, which is obtained by performing frequency division of the oscillation signal, to generate the clocking data, and
wherein the verification data generation circuit performs a second counting operation based on a second clock signal having the same frequency as the clock signal, which is obtained by performing frequency division of the oscillation signal, to generate the verification data.

10. The circuit device according to claim 1,
wherein the clocking circuit performs a first counting operation based on a first clock signal, which is obtained by performing frequency division of the oscillation signal and has a first frequency, to generate the clocking data, and
wherein the verification data generation circuit performs a second counting operation based on a second clock signal, which is obtained by performing frequency division of the oscillation signal and has a second frequency lower than the first frequency, to generate the verification data.

11. A real-time clocking device comprising:
the circuit device according to claim 1; and
the resonator.

12. An electronic apparatus comprising:
the circuit device according to claim 1; and
a device that receives the clocking data and the verification data.

13. The electronic apparatus according to claim 12,
wherein the device performs a process of verifying the clocking data based on the clocking data and the verification data.

14. A vehicle comprising the circuit device according to claim 1.

15. A method of verifying clocking data which is output by a real-time clocking device including a clocking circuit that generates the clocking data based on an oscillation signal and a verification data generation circuit that generates verification data for verifying the clocking data based on the oscillation signal, wherein the clocking data corresponds to real-time clock information indicating an elapsed time, the method comprising:
causing the clocking circuit to perform a process of setting a present time;
reading out the clocking data and the verification data from the real-time clocking device; and
performing a process of verifying the clocking data based on the clocking data and the verification data as read out from the real-time clocking device.

* * * * *